(12) United States Patent
Cho et al.

(10) Patent No.: US 9,668,381 B2
(45) Date of Patent: May 30, 2017

(54) CHANNEL DIVERSION DEVICE AND RELATED HEAT DISSIPATING SYSTEM

(71) Applicant: Wistron Corporation, New Taipei (TW)

(72) Inventors: Shih-Huai Cho, New Taipei (TW); Wen-Hsiung Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 801 days.

(21) Appl. No.: 14/080,729

(22) Filed: Nov. 14, 2013

(65) Prior Publication Data

US 2014/0262151 A1  Sep. 18, 2014

(30) Foreign Application Priority Data

Mar. 14, 2013 (TW) .............................. 102109087 A

(51) Int. Cl.
    H05K 7/20 (2006.01)
(52) U.S. Cl.
    CPC .............................. H05K 7/20727 (2013.01)
(58) Field of Classification Search
    CPC ........... H05K 7/20736; H05K 7/20554; H05K 7/20727; H05K 7/20563; H05K 7/20572; H05K 7/20718; H05K 7/20145
    See application file for complete search history.

(56) References Cited

U.S. PATENT DOCUMENTS

| 5,493,473 A * | 2/1996 | Yanagi ................. H05K 9/0041 165/80.3 |
| 6,052,282 A * | 4/2000 | Sugiyama .......... H05K 7/20572 165/104.33 |
| 6,525,935 B2 * | 2/2003 | Casebolt ................. G06F 1/181 312/236 |

(Continued)

FOREIGN PATENT DOCUMENTS

| TW | M317734 | 8/2007 |
| TW | M338388 | 8/2008 |

OTHER PUBLICATIONS

Office action mailed on Apr. 24, 2015 for the Taiwan application No. 102109087, filing date: Mar. 14, 2013, p. 1 line 12~14, p. 2 line 1~10, line 13~16 and line 20~26 and p. 3 line 1~6 and line 11~14.

(Continued)

*Primary Examiner* — Tho V Duong
(74) *Attorney, Agent, or Firm* — Winston Hsu; Scott Margo

(57) ABSTRACT

A channel diversion device includes a supporting structure, a piercing hole structure, a guiding baffle and a collecting mask. An electronic component can be accommodated inside the supporting structure. The supporting structure includes a first structural layer and a second structural layer. An opening is formed on the second structural layer. The piercing structure is formed on a lateral wall of the first structural layer, and the guiding baffle is disposed by a side of the opening on the second structural layer. The collecting (Continued)

mask is disposed by the first structural layer to cover the piercing hole structure, and a direction of an outlet of the collecting mask is substantially different from a direction of the opening on the second structural layer.

16 Claims, 6 Drawing Sheets

(56) References Cited

U.S. PATENT DOCUMENTS

| | | | | |
|---|---|---|---|---|
| 6,867,967 B2* | 3/2005 | Mok | ................... | G06F 1/16 |
| | | | | 236/49.3 |
| 7,382,613 B2* | 6/2008 | Vinson | ................... | G06F 1/20 |
| | | | | 361/679.48 |
| 7,843,685 B2* | 11/2010 | Beauchamp | ............ | G06F 1/185 |
| | | | | 312/223.2 |
| 8,936,072 B2* | 1/2015 | Senatori | ................... | G06F 1/203 |
| | | | | 165/104.34 |
| 2004/0100774 A1* | 5/2004 | Muennich | .......... | H05K 7/20563 |
| | | | | 361/720 |
| 2012/0162917 A1* | 6/2012 | Chen | ................... | H01L 23/467 |
| | | | | 361/697 |
| 2013/0250517 A1* | 9/2013 | Yang | ................... | G06F 1/20 |
| | | | | 361/697 |

OTHER PUBLICATIONS

Office action mailed/issued on Sep. 26, 2016 for CN application No. 201310113010.1, p. 3 line 5~29, p. 4~6 and p. 7 line 1~16.

\* cited by examiner

CHANNEL DIVERSION DEVICE AND RELATED HEAT DISSIPATING SYSTEM

BACKGROUND OF THE INVENTION

1. Field of the Invention

The present invention relates to a channel diversion device and a related heat dissipating system, and more particularly, to a channel diversion device capable of adjusting directions of thermal currents from several electronic components and the related heat dissipating system.

2. Description of the Prior Art

A conventional rack server and a conventional blade server both include the graphic processor and the main controller. A connection port of the main controller is usually disposed on a surface of the server that does not face the user for preferred aesthetic. A connection port of the graphic processor is disposed on the other surface of the server that faces the user for convenient assembly and disassembly of the connection port. With the advanced technology, operation efficiency of the graphic processor is increased to effectively execute signal processing procedures of the high quality and 3D image, so that the graphic processor is collocated with an active heat dissipating unit to rapidly dissipate heat generated from the graphic processor for increasing the operation efficiency of the graphic processor.

However, the graphic processor with the active heat dissipating unit exhausts airflow with the heat (the thermal current) out of the server via the surface that faces the user, the main controller further exhausts the airflow with the heat (the thermal current) out of the server via the surface that does not face the user. Direction of a heat dissipating airflow field of the graphic processor is different from direction of the heat dissipating airflow field of the main controller, and the reverse airflow fields result in decrease of the heat dissipating efficiency of the graphic processor and the main controller. Therefore, design of a channel diversion device capable of adjusting heat dissipating direction of different electronic components is an important issue in the related mechanical industry.

SUMMARY OF THE INVENTION

The present invention provides a channel diversion device capable of adjusting directions of thermal currents from several electronic components and the related heat dissipating system for solving above drawbacks.

According to the claimed invention, a channel diversion device capable of adjusting airflow direction is disclosed. The channel diversion device includes a supporting structure, a piercing hole structure, a guiding baffle and a collecting mask. The supporting structure accommodates an electronic component. The supporting structure includes a first structural layer and a second structural layer, and an opening being formed on the second structural layer. The piercing hole structure is formed on a lateral wall of the first structural layer. The guiding baffle is disposed by a side of the opening on the second structural layer. The collecting mask is disposed by the first structural layer to cover the piercing hole structure. A direction of an outlet of the collecting mask is substantially different from a direction of the opening on the second structural layer.

According to the claimed invention, the first structural layer is connected to the second structural layer in a stack manner.

According to the claimed invention, the guiding baffle and the collecting mask are isolated in an airtight manner, airflow moves from the guiding baffle to the collecting mask via the supporting structure.

According to the claimed invention, a width of the collecting mask is substantially greater than a width of the supporting structure.

According to the claimed invention, the guiding baffle includes at least one inclined portion disposed by the side of the opening on the second structural layer.

According to the claimed invention, the electronic component is a heat dissipating component having an active radiator.

According to the claimed invention, a heat dissipating system includes a casing and a channel diversion device. The casing includes a first area and a second area. The channel diversion device is disposed on the first area of the casing. The channel diversion device includes a supporting structure, a piercing hole structure, a guiding baffle and a collecting mask. The supporting structure accommodates an electronic component. The supporting structure includes a first structural layer and a second structural layer, and an opening being formed on the second structural layer. The piercing hole structure is formed on a lateral wall of the first structural layer. The guiding baffle is disposed by a side of the opening on the second structural layer. The collecting mask is disposed by the first structural layer to cover the piercing hole structure. A direction of an outlet of the collecting mask is substantially different from a direction of the opening on the second structural layer.

According to the claimed invention, the first area and the second area of the casing are isolated by the supporting structure in an airtight manner. The supporting structure and the casing are isolated by the guiding baffle and the collecting mask in an airtight manner.

According to the claimed invention, the airflow with heat generated from the electronic component passes through the piercing hole structure along a first direction to move out of the supporting structure. The airflow is turned by the collecting mask to pass through the second area along a second direction different from the first direction to move out of the casing.

According to the claimed invention, the active radiator drives the airflow into the supporting structure along the guiding baffle, the airflow passes through the piercing hole structure to move from the supporting structure into the collecting mask, the collecting mask turns a moving direction of the airflow, and the airflow passes through the second area to move out of the casing.

The channel diversion device of the present invention utilizes the guiding baffle and the collecting mask to isolate the supporting structure and the casing in the airtight manner. Even through connection ports of the electronic component and the controller respectively face different sides of the casing, the present invention can isolate the thermal current (the airflow with the heat) generated from the electronic component disposed inside the supporting structure and from the controller disposed inside the second area of the casing without reverse conflict. Further, the collecting mask of the channel diversion device can reverse the moving direction of the airflow exhausting from the supporting structure, so that the channel diversion device is able to combine the thermal current from the electronic component and the controller as an integrated current, rather than generate the turbulence, for increasing the heat dissipating efficiency of the heat dissipating system.

In addition, the channel diversion device of the present invention further utilizes isolation between the guiding baffle and the collecting mask to divide the external airflow (the cold air) from the airflow (the warm air) through the electronic component, so as to effectively prevent the heat dissipating efficiency of the heat dissipating system from decrease because of an reverse of the thermal current. Comparing to the prior art, the channel diversion device and the related heat dissipating system of the present invention can solve drawbacks of the low heat dissipating efficiency due to the reverse of the thermal current in the conventional device. The present invention can simultaneously increase the heat dissipating efficiency of the inner flow field (the electronic component) and the outer flow field (the controller), so that the channel diversion device is suitably applied to the blade server and the rack server for increasing expansion efficiency of the related circuit board, such as the PCI-E card.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
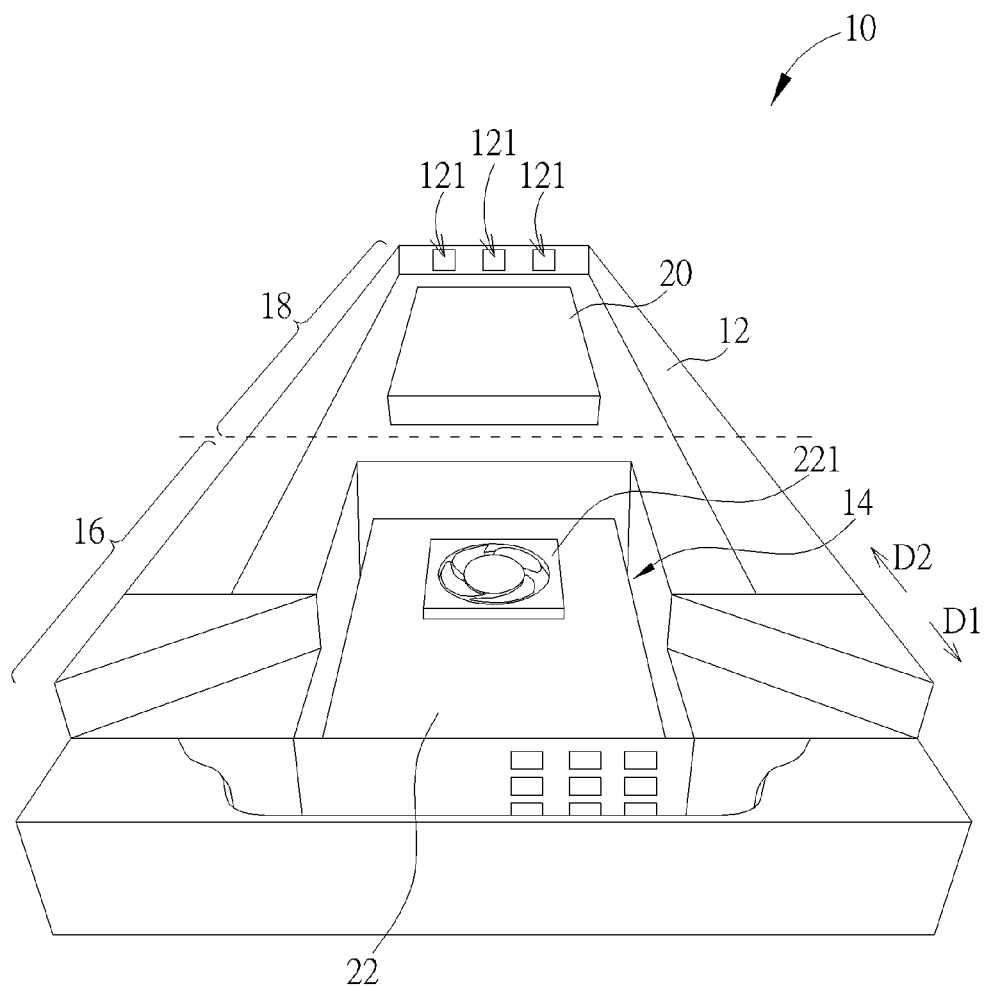
FIG. 1 is a diagram of a heat dissipating system according to an embodiment of the present invention.

Please refer to FIG. 1. FIG. 1 is a diagram of a heat dissipating system 10 according to an embodiment of the present invention. The heat dissipating system 10 includes a casing 12 and a channel diversion device 14. The casing 12 can include a first area 16 and a second area 18. The channel diversion device 14 is disposed inside the first area 16, and a controller 20 of the heat dissipating system 10 can be disposed inside the second area 18. The channel diversion device 14 supports an electronic component 22, such as the heat dissipating component with an active radiator. Thermal current (airflow with heat) generated from the electronic component 22 can be exhausted from the first area 16 along a first direction D1. A moving direction of the airflow with the heat is turned by the channel diversion device 14, the thermal current from the electronic component 22 can move from the first area 16 to the second area 18, and is exhausted out of the casing 12 via the heat dissipating holes 121 along a second direction D2 different from the first direction D1 with heat generated from the controller 20, so as to achieve the preferred heat dissipating efficiency.

Figure 2:
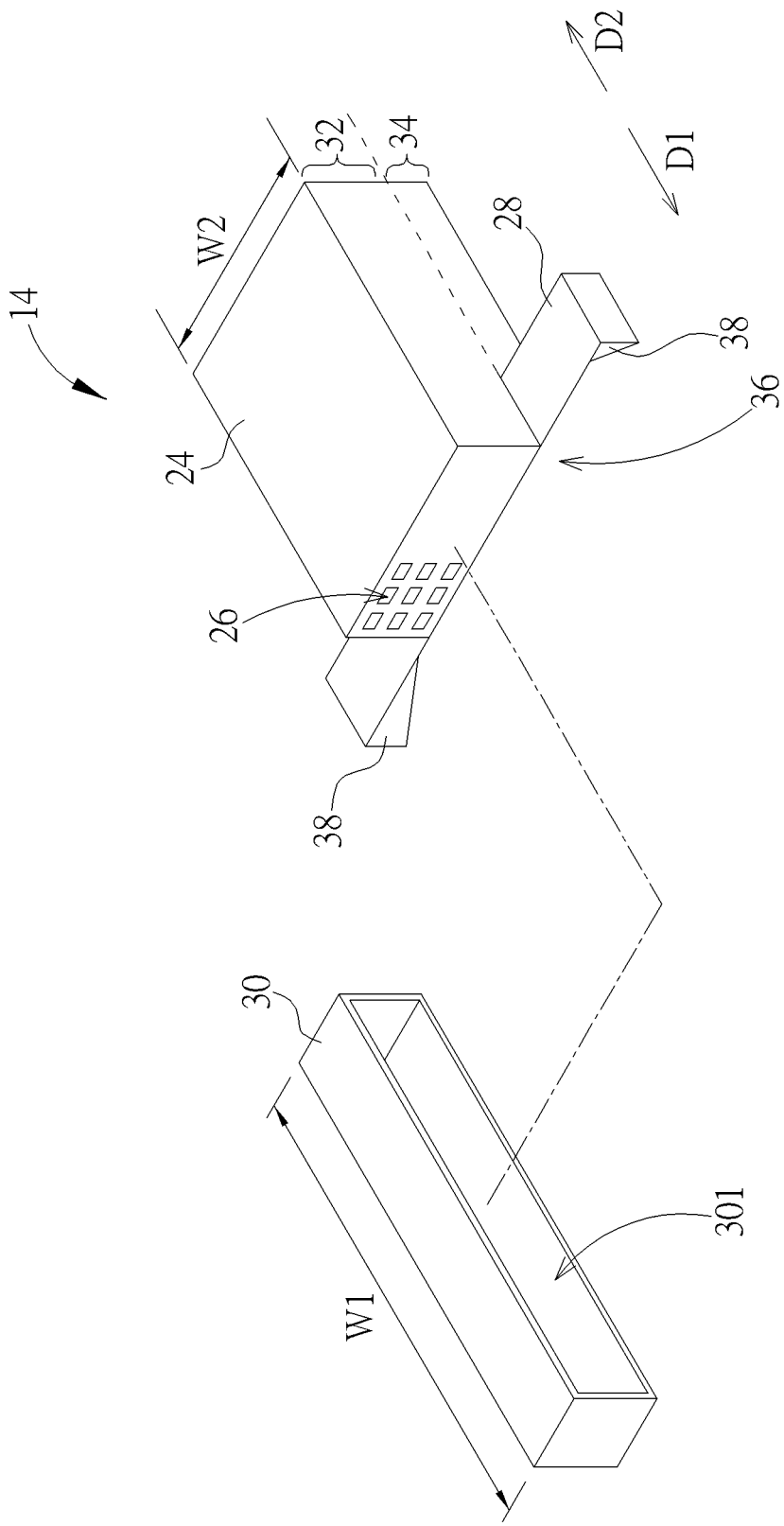
FIG. 2 is a diagram of a channel diversion device in the other view according to the embodiment of the present invention.
Figure 3:
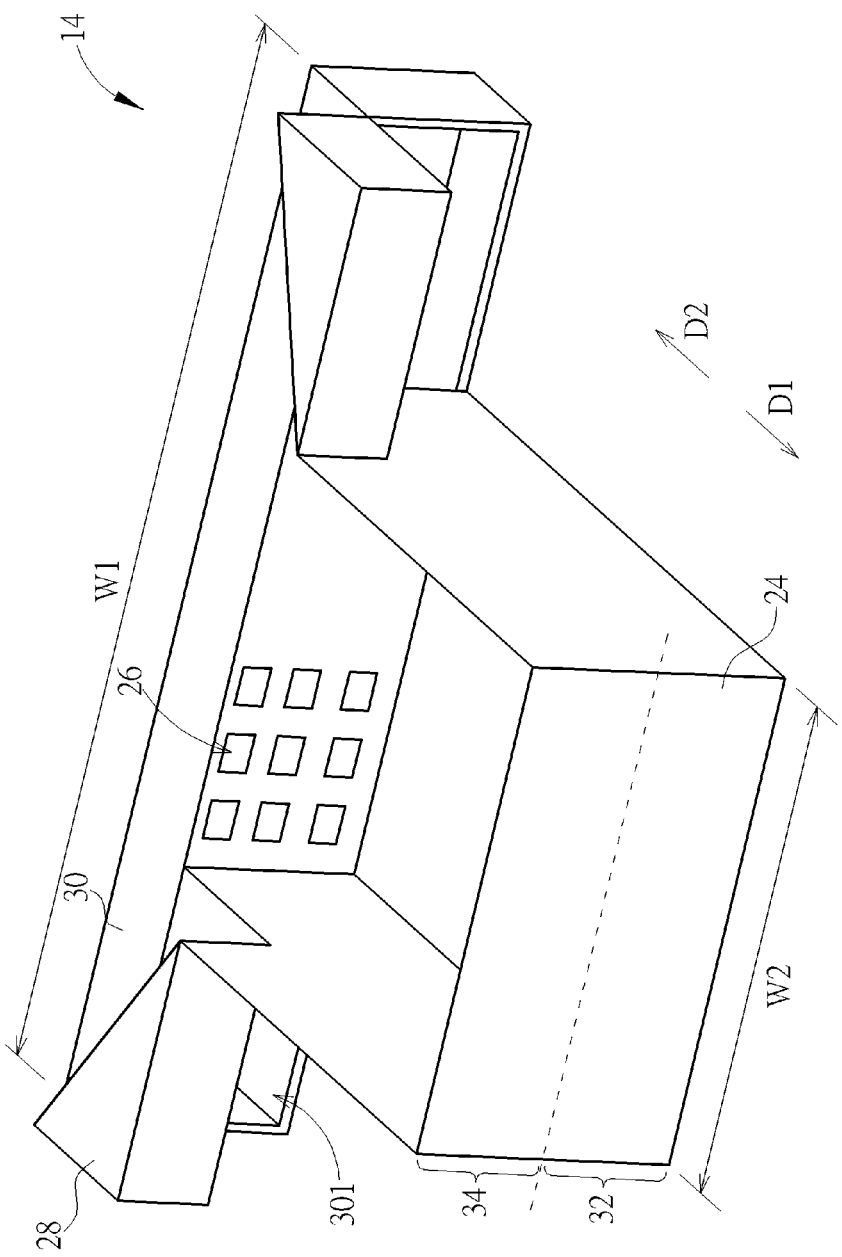
FIG. 3 is an assembly diagram of the channel diversion device in the other view according to the embodiment of the present invention.

Please refer to FIG. 1 to FIG. 3. FIG. 2 is a diagram of the channel diversion device 14 in the other view according to the embodiment of the present invention. FIG. 3 is an assembly diagram of the channel diversion device 14 in the other view according to the embodiment of the present invention. The channel diversion device 14 includes a supporting structure 24, a piercing hole structure 26, a guiding baffle 28 and a collecting mask 30. The supporting structure 24 includes a first structural layer 32 and a second structural layer 34, and the first structural layer 32 is connected to the second structural layer 34 in a stack manner. The electronic component 22 can be disposed inside the first structural layer 32 of the supporting structure 24, and the active radiator 221 of the electronic component 22 faces the second structural layer 34 to inhale external airflow. An opening 36 is formed on the second structural layer 34. The external airflow moves into the supporting structure 24 via the opening 36.

It should be mentioned that the first area 16 and the second area 18 of the casing 12 can be isolated by the supporting structure 24 in an airtight manner, so the thermal current generated from the electronic component 22 cannot move from the first area 16 to the second area 18 directly. The airflow with the heat is guided by the collecting mask 30 to move toward the second area 18 through an outside of the supporting structure 24, and the channel diversion device 14 can adjust a heat dissipating airflow field of the electronic component 22 in the same direction as the heat dissipating airflow field of the controller 20.

The piercing hole structure 26 is formed on a lateral wall of the first structural layer 32. The inner airflow of the channel diversion device 14 can move out of the supporting structure 24 via the piercing hole structure 26. The guiding baffle 28 is disposed by a side of the opening 36 on the second structural layer 34. The guiding baffle 28 can increase an inhaling angle of the opening 36, so as to guide a great quantity of the airflow into the supporting structure 24 via the opening 36. Generally, the guiding baffle 28 can preferably include at least one inclined portion 38 disposed by the opening 36. The inclined portion 38 can guide the great quantity of the external airflow into the supporting structure 24 rapidly, so as to create the large airflow rate in short time and to increase the heat exchanging efficiency of the heat dissipating system 10.

The collecting mask 30 is disposed by the first structural layer 32 to cover the piercing hole structure 26. A direction (which equals the second direction D2 substantially) of an outlet 301 of the collecting mask 30 points toward the second area 18, and is different from a direction (which equals the first direction D1 substantially) of the opening 36 on the second structural layer 34. In this embodiment, the guiding baffle 28 and the collecting mask 30 are filled inside a gap between the supporting structure 24 and the casing 12, so as to prevent the airflow from moving between the supporting structure 24 and the casing 12 via the path excluding the guiding baffle 28 and the collecting mask 30. It is to say, the supporting structure 24 and the casing 12 are isolated by an assembly of the guiding baffle 28 and the collecting mask 30. Thus, the internal airflow of the supporting structure 24 can move into the collecting mask 30 through the piercing hole structure 26 along the first direction D1, the collecting mask 30 turns the moving direction of the airflow, and the airflow moves toward the second area 18 of the casing 12 along the second direction D2 for an aim of adjusting the airflow direction in the present invention.

As shown in FIG. 1 to FIG. 3, the guiding baffle 28 and the collecting mask 30 are isolated in the airtight manner and respectively disposed on the second structural layer 34 and the first structural layer 32, so that the airflow moving from the outside of the casing 12 into the supporting structure 24 via the guiding baffle 28 cannot directly enter the collecting mask 30. The airflow passes through the guiding baffle 28 to move into the supporting structure 24, then continuously passes through the second structural layer 34 and the first structural layer 32 in sequence, and moves toward the collecting mask 30 via the piercing hole structure 26. The collecting mask 30 turns the moving direction of the airflow. Therefore, a width W1 of the collecting mask 30 can be substantially greater than a width W2 of the supporting structure 24, which means an end (or two ends) of the collecting mask 30 protrudes from a boundary of the supporting structure 24, and the airflow out of the supporting structure 24 can be reversed by the collecting mask 30 and move relative to outer walls of the supporting structure 24 along the second direction D2.

Figure 4:
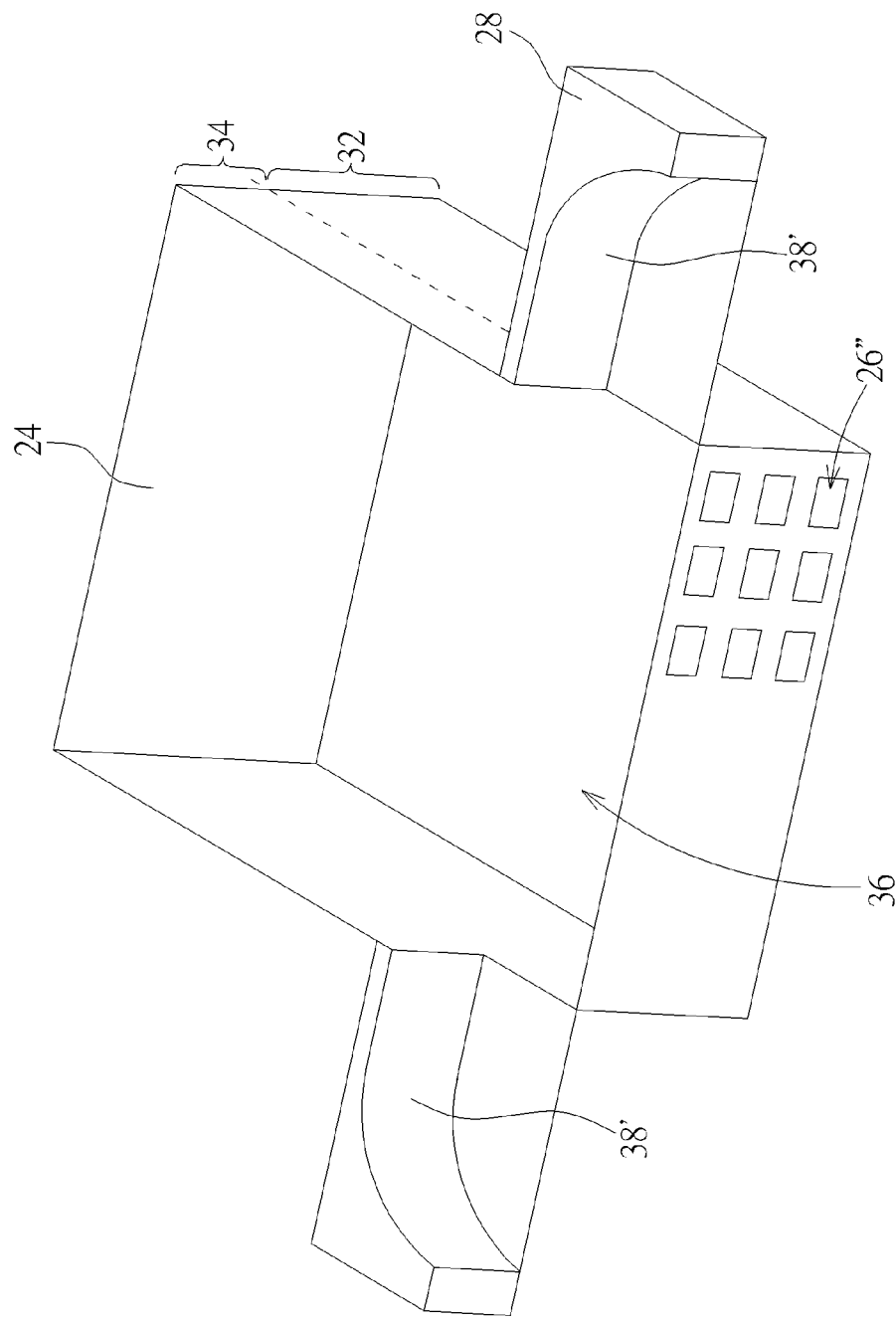
FIG. 4 and FIG. 5 respectively are diagrams of a guiding baffle according to different embodiments of the present invention.
Figure 5:
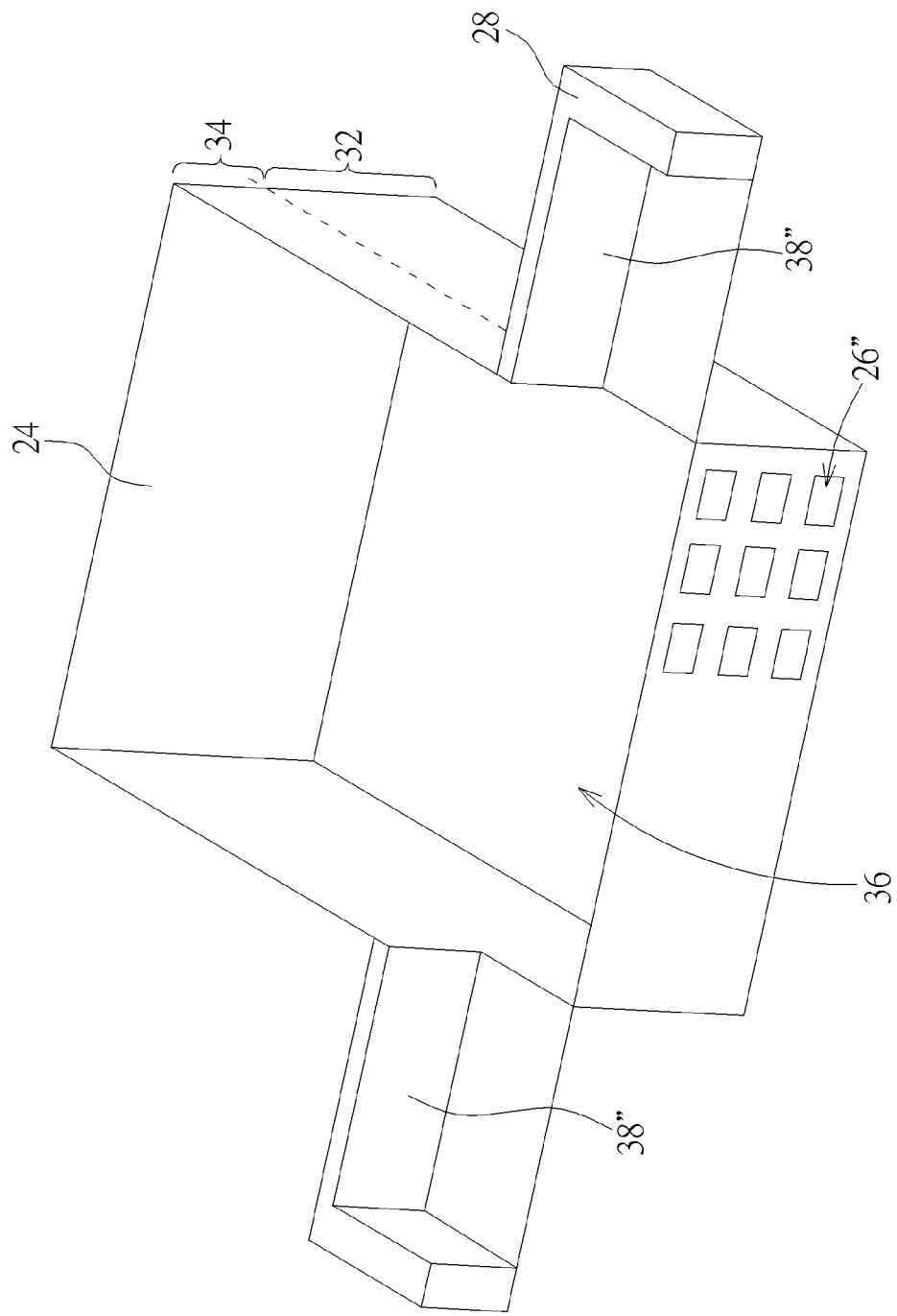

Please refer to FIG. 4 and FIG. 5. FIG. 4 and FIG. 5 respectively are diagrams of the guiding baffle 28 according to different embodiments of the present invention. As shown in FIG. 4, the inclined portion 38' of the guiding baffle 28 can be an arc curved structure. As shown in FIG. 5, the inclined portion 38' of the guiding baffle 28 can be a sunken structure with any shapes. The inclined portion is utilized to expand dimensions of the opening for increasing the quantity of the airflow entering the supporting structure 24. Structure capable of expending the dimensions of the opening 36 belongs to the design scope of the guiding baffle in the present invention, which is not limited to ones of the above-mentioned embodiment, and a detailed description is omitted herein for simplicity.

Figure 6:
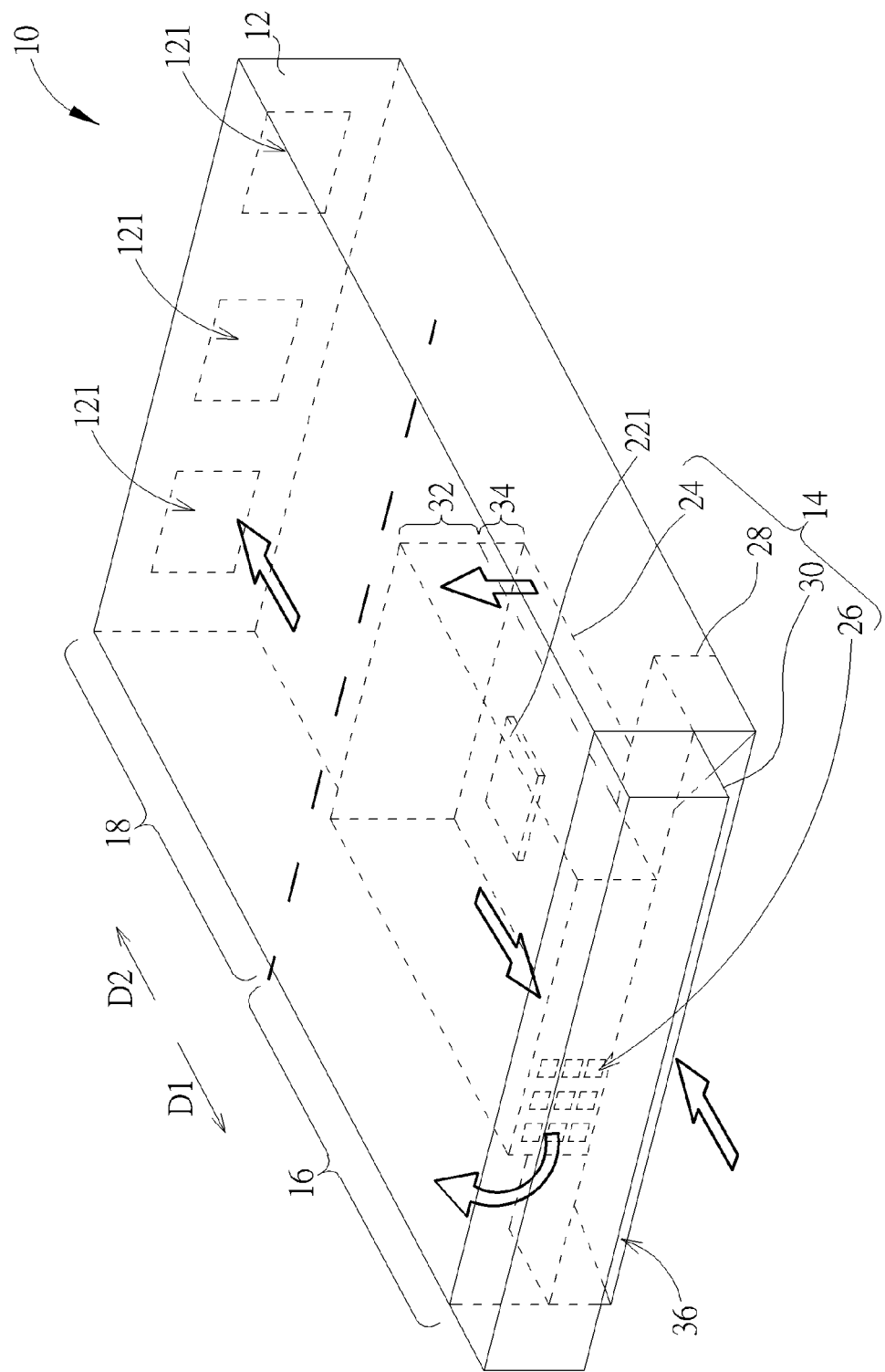
FIG. 6 is a diagram of the airflow trend of the heat dissipating system according to the embodiment of the present invention.

Please refer to FIG. 1 and FIG. 6. FIG. 6 is a diagram of the airflow trend of the heat dissipating system 10 according to the embodiment of the present invention. As shown in FIG. 6, the active radiator 221 of the electronic component 22 is actuated, the external airflow (the cold air) moves from the outside of the heat dissipating system 10 into the second structural layer 34 of the supporting structure 24 via the opening 36 along an arrow shown in FIG. 6. The electronic component 22 disposed on the first structural layer 32 inhales the external airflow (the cold air) into the structure for heat exchange, then the airflow moves along an arrow from the second structural layer 34 to the first structural layer 32 as shown in FIG. 6.

The airflow with the heat (the thermal current or the warm air) is exhausted by the electronic component 22. The airflow (the warm air) passes through the piercing hole structure 26 along the first direction D1 to move out of the supporting structure 24. After leaving the supporting structure 24, the airflow (the warm air) enters the collecting mask 30 immediately, as an arrow shown in FIG. 6. The moving direction of the airflow (the warm air) is reversed by the collecting mask 30, so that the airflow (the warm air) moves from the outlet 301 to the second area 18 along the second direction D2, and is away from the casing 12 via the heat dissipating holes 121. Therefore, the present invention can exhaust the thermal current inside the heat dissipating system 10, such as the heat generated from the controller 20 or the electronic component 22, from the casing 12 along the same direction (the second direction D2).

In conclusion, the channel diversion device of the present invention utilizes the guiding baffle and the collecting mask to isolate the supporting structure and the casing in the airtight manner. Even through connection ports of the electronic component and the controller respectively face different sides of the casing, the present invention can isolate the thermal current (the airflow with the heat) generated from the electronic component disposed inside the supporting structure and from the controller disposed inside the second area of the casing without reverse conflict. Further, the collecting mask of the channel diversion device can reverse the moving direction of the airflow exhausting from the supporting structure, so that the channel diversion device is able to combine the thermal current from the electronic component and the controller as an integrated current, rather than generate the turbulence, for increasing the heat dissipating efficiency of the heat dissipating system.

In addition, the channel diversion device of the present invention further utilizes isolation between the guiding baffle and the collecting mask to divide the external airflow (the cold air) from the airflow (the warm air) through the electronic component, so as to effectively prevent the heat dissipating efficiency of the heat dissipating system from decrease because of an reverse of the thermal current. Comparing to the prior art, the channel diversion device and the related heat dissipating system of the present invention can solve drawbacks of the low heat dissipating efficiency due to the reverse of the thermal current in the conventional device. The present invention can simultaneously increase the heat dissipating efficiency of the inner flow field (the electronic component) and the outer flow field (the controller), so that the channel diversion device is suitably applied to the blade server and the rack server for increasing expansion efficiency of the related circuit board, such as the PCI-E card.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A channel diversion device applied to be disposed on a first area of a casing and capable of adjusting airflow direction, the channel diversion device comprising:
   a supporting structure for accommodating an electronic component, the supporting structure comprising a first structural layer and a second structural layer, an opening being formed on the second structural layer, and external airflow moving into the supporting structure via the opening along a second direction, wherein the first area and a second area of the casing are isolated by the supporting structure in an airtight manner;
   a piercing hole structure formed on a lateral wall of the first structural layer and adjacent by the opening, wherein the piercing hole structure and the opening are disposed at a same side of the supporting structure;
   a guiding baffle disposed by a side of the opening on the second structural layer; and
   a collecting mask disposed by the first structural layer to cover the piercing hole structure, and a normal vector of an inner bottom of the collecting mask pointing toward the second area and being parallel to the second direction, wherein the supporting structure and the casing are isolated by the guiding baffle and the collecting mask in an airtight manner.

2. The channel diversion device of claim 1, wherein the first structural layer is connected to the second structural layer in a stack manner.

3. The channel diversion device of claim 1, wherein the guiding baffle and the collecting mask are isolated in an airtight manner, airflow moves from the guiding baffle to the collecting mask via the supporting structure.

4. The channel diversion device of claim 1, wherein a width of the collecting mask is greater than a width of the supporting structure.

5. The channel diversion device of claim 4, wherein at least one end of the collecting mask protrudes from a boundary of the supporting structure.

6. The channel diversion device of claim 1, wherein the guiding baffle comprises at least one inclined portion disposed by the side of the opening on the second structural layer.

7. The channel diversion device of claim 1, wherein the electronic component is a heat dissipating component having an active radiator.

8. A heat dissipating system comprising:
a casing, the casing comprising a first area and a second area; and
a channel diversion device disposed on the first area of the casing, the channel diversion device comprising:
a supporting structure for accommodating an electronic component, the supporting structure comprising a first structural layer and a second structural layer, an opening being formed on the second structural layer, and external airflow moving into the supporting structure via the opening along a second direction, wherein the first area and the second area of the casing are isolated by the supporting structure in an airtight manner;
a piercing hole structure formed on a lateral wall of the first structural layer and adjacent by the opening, wherein the piercing hole structure and the opening are disposed at a same side of the supporting structure;
a guiding baffle disposed by a side of the opening on the second structural layer; and
a collecting mask disposed by the first structural layer to cover the piercing hole structure, a normal vector of an inner bottom of the collecting mask pointing toward the second area and being parallel to the second direction, wherein the supporting structure and the casing are isolated by the guiding baffle and the collecting mask in an airtight manner.

9. The heat dissipating system of claim 8, wherein the first structural layer is connected to the second structural layer in a stack manner.

10. The heat dissipating system of claim 8, wherein the guiding baffle and the collecting mask are isolated in an airtight manner, airflow moves from the guiding baffle to the collecting mask via the supporting structure.

11. The heat dissipating system of claim 8, wherein a width of the collecting mask is greater than a width of the supporting structure.

12. The heat dissipating system of claim 11, wherein at least one end of the collecting mask protrudes from a boundary of the supporting structure.

13. The heat dissipating system of claim 8, wherein the guiding baffle comprises at least one inclined portion disposed by the side of the opening on the second structural layer.

14. The heat dissipating system of claim 8, wherein the electronic component is a heat dissipating component having an active radiator.

15. The heat dissipating system of claim 8, wherein airflow with heat generated from the electronic component passes through the piercing hole structure along a first direction to move out of the supporting structure, the airflow is turned by the collecting mask to pass through the second area along a second direction different from the first direction to move out of the casing.

16. The heat dissipating system of claim 14, wherein the active radiator drives airflow into the supporting structure along the guiding baffle, the airflow passes through the piercing hole structure to move from the supporting structure into the collecting mask, the collecting mask turns a moving direction of the airflow, and the airflow passes through the second area to move out of the casing.

* * * * *